US011177223B1

(12) United States Patent
Patil et al.

(10) Patent No.: US 11,177,223 B1
(45) Date of Patent: Nov. 16, 2021

(54) ELECTROMAGNETIC INTERFERENCE SHIELDING FOR PACKAGES AND MODULES

(71) Applicant: QUALCOMM Incorporated, San Diego, CA (US)

(72) Inventors: Aniket Patil, San Diego, CA (US); Hong Bok We, San Diego, CA (US); Brigham Navaja, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/010,676

(22) Filed: Sep. 2, 2020

(51) Int. Cl.
*H05K 1/02* (2006.01)
*H01L 23/552* (2006.01)
*H05K 1/09* (2006.01)
*H05K 1/11* (2006.01)

(52) U.S. Cl.
CPC ......... *H01L 23/552* (2013.01); *H05K 1/0219* (2013.01); *H05K 1/092* (2013.01); *H05K 1/111* (2013.01); *H05K 2201/10734* (2013.01)

(58) Field of Classification Search
CPC .... H01L 23/552; H05K 1/0219; H05K 1/111; H05K 1/092; H05K 2201/10734
USPC ......................................................... 361/818
See application file for complete search history.

(56) References Cited

U.S. PATENT DOCUMENTS

| | | | |
|---|---|---|---|
| 2010/0182765 A1* | 7/2010 | Vadas | H05K 1/0218 361/818 |
| 2020/0168557 A1* | 5/2020 | Tsai | H01L 21/561 |

\* cited by examiner

*Primary Examiner* — Sherman Ng
(74) *Attorney, Agent, or Firm* — Muncy, Geissler, Olds & Lowe, P.C.

(57) ABSTRACT

Disclosed is an apparatus and methods for making same. The apparatus includes a substrate, a set of electrical contacts disposed on the surface of the substrate, and an electromagnetic interference (EMI) shield pedestal structure, disposed between an outer periphery of the set of electrical contacts and an outer portion of the substrate.

22 Claims, 10 Drawing Sheets

(i)

(ii)

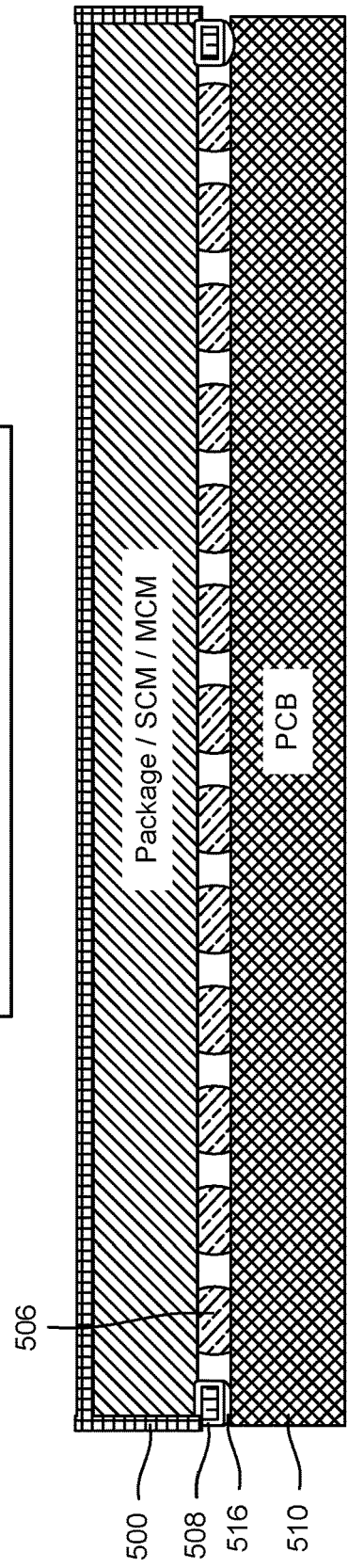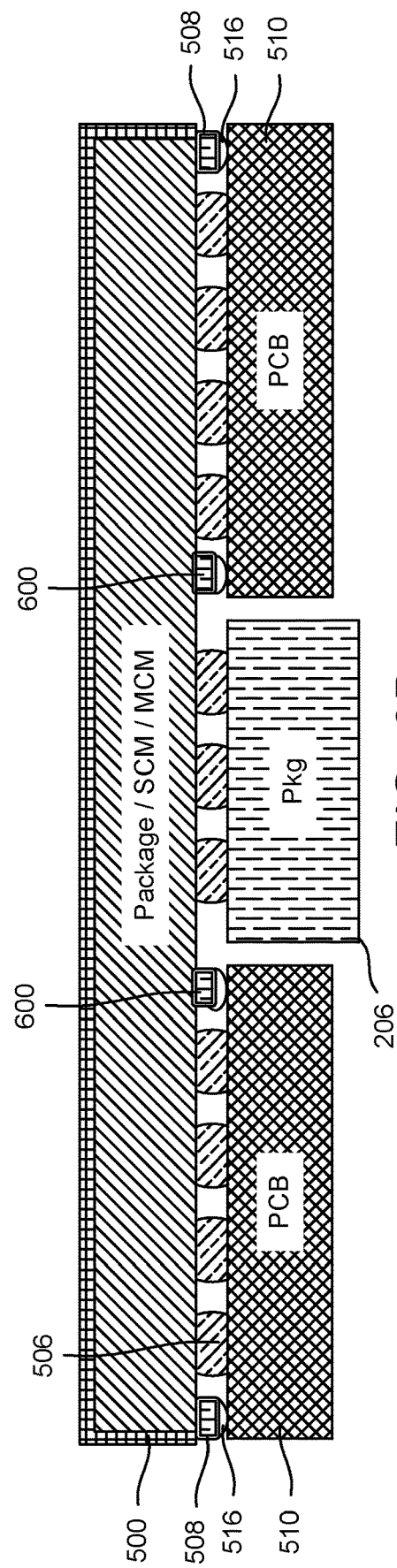
FIG. 6A
FIG. 6B

ELECTROMAGNETIC INTERFERENCE SHIELDING FOR PACKAGES AND MODULES

FIELD OF DISCLOSURE

This disclosure relates generally to package devices, and more specifically, but not exclusively, to electromagnetic interference shielding for packages and modules and fabrication techniques thereof.

BACKGROUND

Integrated circuit technology has achieved great strides in advancing computing power through miniaturization of active components. There is a constant demand for chipsets that are faster, more capable, and higher performance, yet with smaller and smaller packaging sizes. A ball grid array (BGA) is a type of surface-mount packaging (a chip carrier) used for integrated circuits. BGA packages are used to permanently mount devices such as microprocessors. A BGA can provide more interconnection pins than can be put on a dual in-line or flat package. The whole bottom surface of the device can be used, instead of just the perimeter. The traces connecting the package's leads to the wires or balls which connect the die to package are also on average shorter than with a perimeter-only type, leading to better performance at high speeds. A multi-chip module may also have BGA pins.

FIG. 1 shows the layout of electrical contacts (which may also be referred to herein as contacts, connectors, electrical connectors, or pins) on a conventional BGA module 100. The pins located on the outer and inner peripheries of the array are darker in FIG. 1 to visually distinguish them from the other pins, which are lighter in FIG. 1. In FIG. 1, the outermost connectors of the array form the outer periphery, and the connectors of the array that most closely surround and enclose a gap in the array, i.e., locations on the grid where connectors could be but aren't, form an inner periphery. As can be seen in FIG. 1, some connectors may be both part of the outer periphery and part of an inner periphery. FIG. 1 includes a closeup of a portion of the BGA module 100. The darker pins are typically tied to ground or a common supply in order to shield the lighter pins from electromagnetic interference (EMI). The EMI shield thus provided allows the module to perform well even in the presence of EMI.

FIGS. 2A and 2B illustrate example uses of the conventional BGA module 100. FIG. 2A shows BGA module 100 mounted to a printed circuit board (PCB) 200, showing that the outermost connectors of the grid array protect the inner connectors of the grid array, which are used for signals or power, from EMI interference. Thus, FIG. 2A shows a configuration in where there is only an outer periphery of connectors used as an EMI shield. FIG. 2B shows BGA module 100 mounted to PCB 202 and PCB 204, which may be separate PCBs or different portions of the same PCB. In FIG. 2B, another package or device 206 is also mounted to BGA module 100. In this configuration, BGA module 100 has both an outer periphery and an inner periphery of connectors that form an EMI shield or shields to protect the other connectors from EMI.

One disadvantage of the conventional BGA module 100 is that the use of the connectors along the outer and inner peripheries of the array reduces the number of connectors that may be put to functional use, e.g., to be used for signaling and power. The connectors used for the EMI shield typically account for 15% of the total number of connectors in the array—although that percentage may be higher or lower, depending on the dimensions of the BGA—which means that 15% fewer connectors can be used for signaling and power and is a common reason why a larger module size is required. If the connectors currently used for EMI shielding could be used for signaling and power instead, a smaller module size may be used, which lowers the cost of the BGA module and reduces the space that the BGA module occupies, both of which are desirable outcomes.

Accordingly, there is a need for a package structure which provides EMI shielding and allows connectors on the outer and inner peripheries to be put to functional use.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In accordance with the various aspects disclosed herein, a novel electromagnetic interference (EMI) shield pedestal structure for packages and modules is presented, in which an EMI shield pedestal structure is disposed in available space between the outer periphery of a ball grid array or other set of electrical contacts and an outer portion of the module, such as an outer boundary or edge. A similar structure may be constructed adjacent to an inner periphery of the ball grid array or other set of electrical contacts.

In accordance with the various aspects disclosed herein, at least one aspect includes an apparatus. The apparatus includes a substrate, a set of electrical contacts disposed on the surface of the substrate, and an electromagnetic interference (EMI) shield pedestal structure, disposed between an outer periphery of the set of electrical contacts and an outer portion of the substrate.

In accordance with the various aspects disclosed herein, at least one aspect includes, a method for fabricating an apparatus. The method includes forming a set of electrical contacts disposed on the surface of a substrate, and forming an EMI shield pedestal structure, disposed between an outer periphery of the plurality of electrical contacts and an outer portion of the surface of the substrate.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

FIGS. 6A and 6B illustrate example uses of the apparatus;

Figure 1:
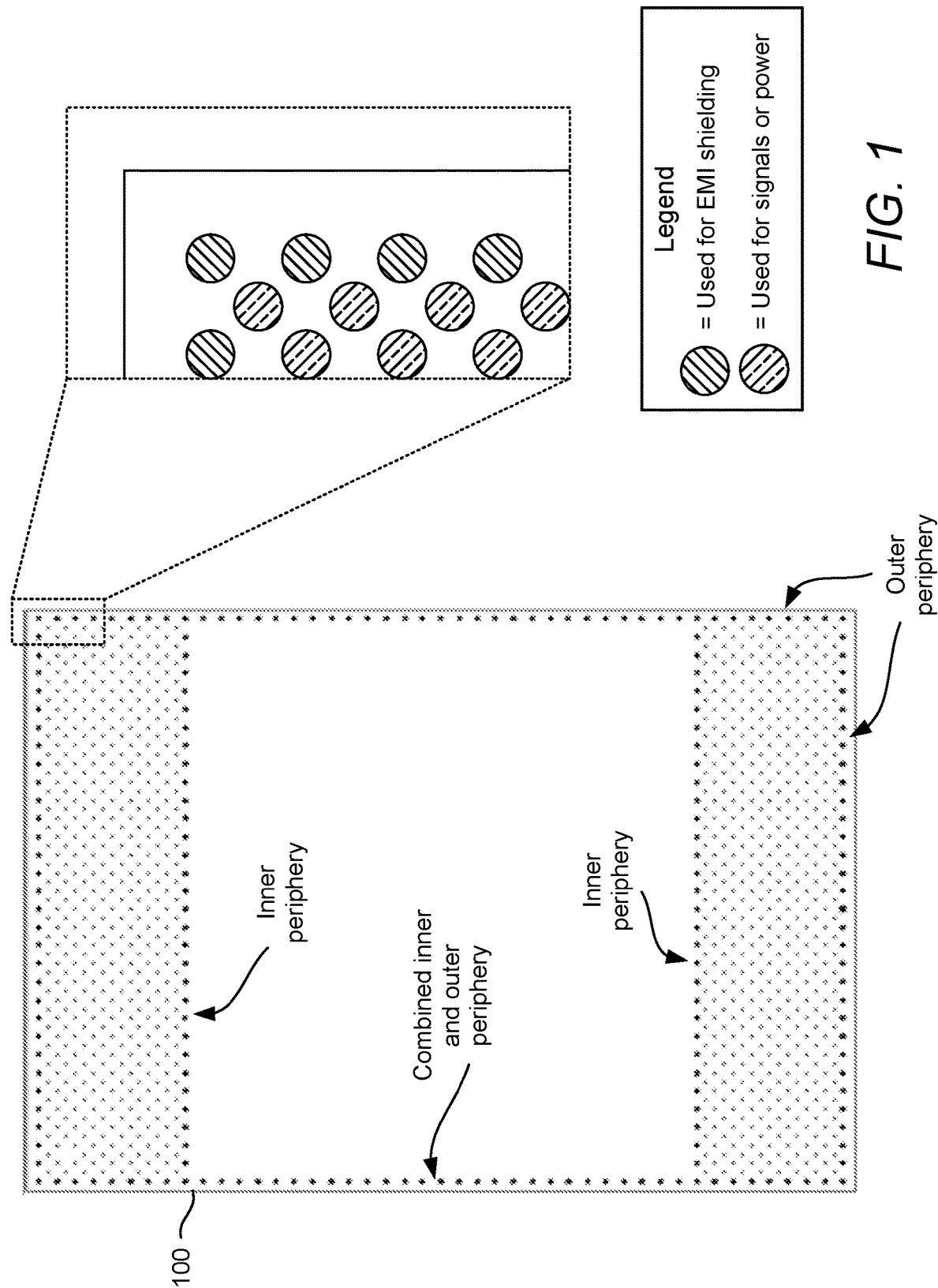
FIG. 1 shows the layout of connectors on a conventional BGA module.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

In order to address the deficiencies of conventional packages and modules described above, a novel EMI shield pedestal structure for packages and modules having a set of connectors, such as ball grid array (BGA), land grid array (LGA), copper-pillar, and other types is presented, in which an EMI shield pedestal structure is disposed in available space between the outer periphery of the electrical connections and the module outer boundary or edge. A similar structure may be constructed adjacent to an inner periphery within the set of electrical connections. The EMI shield pedestal structure is separate from, and may be constructed separately from, the set of connectors, and may be a bar and/or a set of pillars made from photo material build-up printed on top of a module substrate.

For BGA packages, for example, because the EMI shield pedestal structure is constructed in the space between the BGA pins and the outer substrate edge, the EMI shield pedestal structure can be used in existing BGA packages or modules without further modification. The EMI shield pedestal structure disclosed herein obviates the need to use the outer or inner periphery of BGA connectors for EMI shielding purposes. Those connectors that were formerly used only for EMI shielding are thus made available for use as signal or power connectors. This may allow the use of a smaller BGA package or module compared to a conventional BGA package and module, which may translate into a reduction in cost of the BGA package or module as well as a reduction in the space required for that BGA package or module. Where the EMI shield pedestal structure is a continuous bar structure, the EMI shield pedestal structure operates as a conformal structure, e.g., to protect the inner components from environmental conditions. The same EMI shield pedestal structure may be used for other types of packages or modules, including, but not limited to, those using LGA, copper-pillar, or other types of electrical contacts.

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Figure 3:
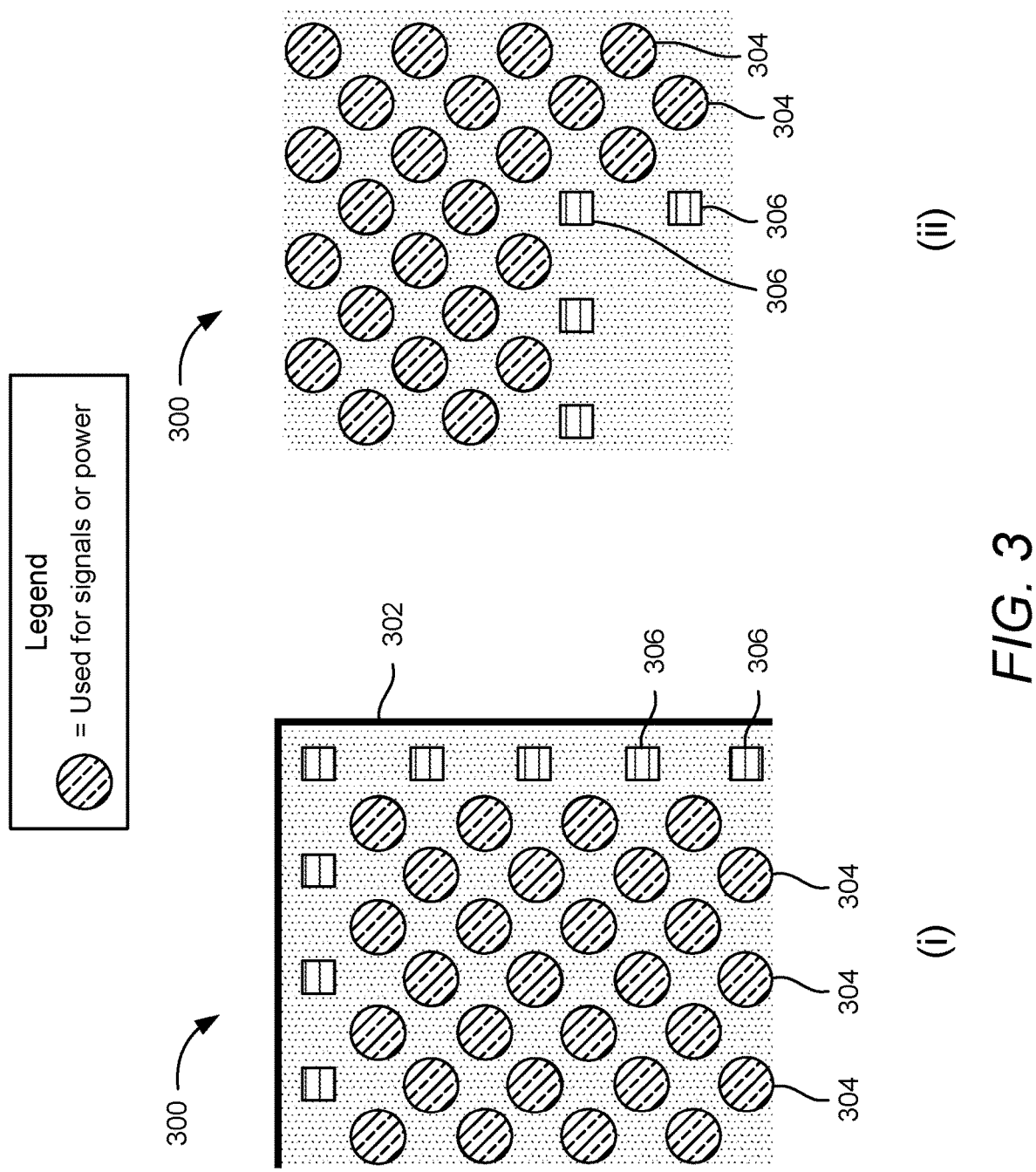
FIG. 3 shows a portion of an exemplary apparatus according to one or more aspects.

FIG. 3 shows a portion of an exemplary apparatus 300 according to one or more aspects of the disclosure. The apparatus 300 may be a package or module. For the purposes of illustration, FIG. 3 shows a ball grid array (BGA) package or module, but the same concepts disclosed herein can also be applied to other types of packages or modules, including, but not limited to, packages using land grid array (LGA) electrical connectors, copper pillar electrical connectors, or other types of electrical connectors. FIG. 3 is a closeup of one corner of the apparatus 300, showing the boundary or edge 302 of the apparatus 300, some of the BGA connectors 304 that make up the ball grid array, and a set of EMI shield pedestal structures 306 that are placed in the area between the outer boundary of the array of BGA connectors 304 and an outer portion of the substrate, e.g., between the BGA connectors and the apparatus edge 302. The BGA connectors 304 are represented in FIG. 3 as circles and the EMI shield pedestal structures 306 are represented in FIG. 3 as squares, although the exact shapes of the BGA connectors 304 and EMI shield pedestal structures 306 may vary. It is noted that only a representative few of the BGA connectors 304 and EMI shield pedestal structures 306 are numbered as such; it will be understood that unnumbered structures in FIG. 3 will have the same element number is numbered structures having the same shape. By placing EMI shield pedestal structures 306 in the available space between the BGA connectors 304 and the edge 302 of the apparatus (which may also be referred to as the perimeter of the apparatus, the periphery of the apparatus, the boundary of the apparatus, etc.), none of the BGA connectors 304 are required for EMI shielding, and are thus available for use for signaling or power. FIG. 3 also illustrates an open space within the array with no BGA connectors 304. Here, also, EMI shield pedestal structures 306 may be placed so as to protect the BGA connectors 304 within the middle of the array from EMI.

Figure 4:
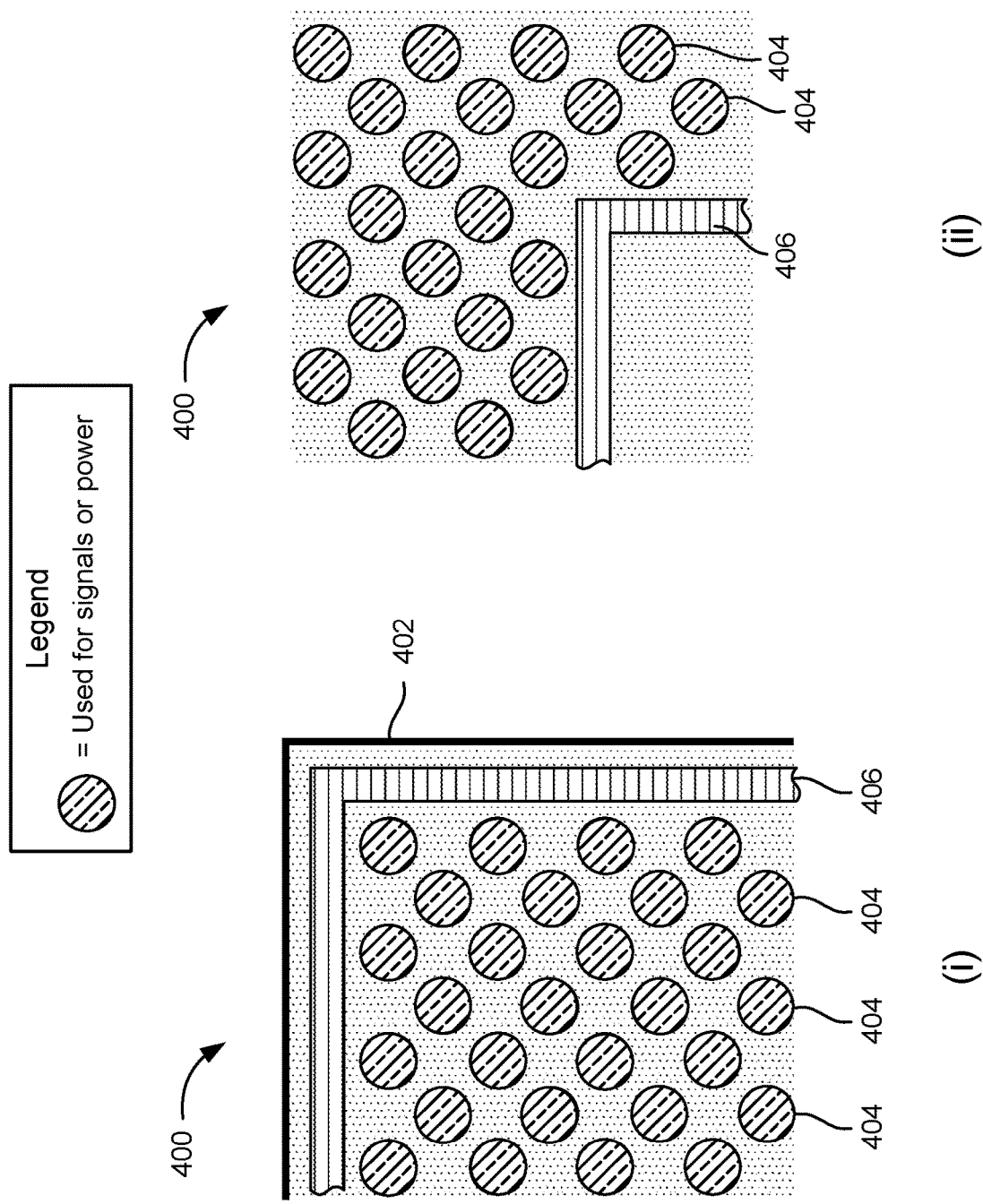
FIG. 4 shows a portion of another exemplary apparatus according to one or more aspects.

FIG. 4 shows a portion of an exemplary apparatus 400 according to one or more aspects of the disclosure. The apparatus 400 may be BGA package or module. For the purposes of illustration, FIG. 4 shows a ball grid array (BGA) package or module, but the same concepts disclosed herein can also be applied to other types of packages or modules, including, but not limited to, packages using land grid array (LGA) electrical connectors, copper pillar electrical connectors, or other types of electrical connectors. FIG. 4 is a closeup of one corner of the apparatus 400, showing the edge or boundary 402 of the apparatus 400, some of the BGA connectors 404 that make up the ball grid array, and an EMI shield pedestal structure 406 that is placed in the area between the outer boundary of the array of BGA connectors 404 and the apparatus edge 402. The BGA connectors 404 are represented in FIG. 4 as circles and the EMI shield pedestal structure 406 is represented in FIG. 4 as rectilinear, although the exact shapes of the BGA connectors 404 and EMI shield pedestal structure 406 may vary. It is noted that only a representative few of the BGA connectors 404 are numbered as such; it will be understood that unnumbered structures in FIG. 4 will have the same element number is numbered structures having the same shape. By placing the EMI shield pedestal structure 406 in the available space between the BGA connectors 404 and the edge 402 of the apparatus, none of the BGA connectors 404 are required for EMI shielding, and are thus available for use for signaling or power. FIG. 4 also illustrates an open space within the array with no BGA connectors 404. Here, also, an EMI shield pedestal structure 406 may be placed so as to protect the BGA connectors 404 within the middle of the array from EMI.

Figure 5:
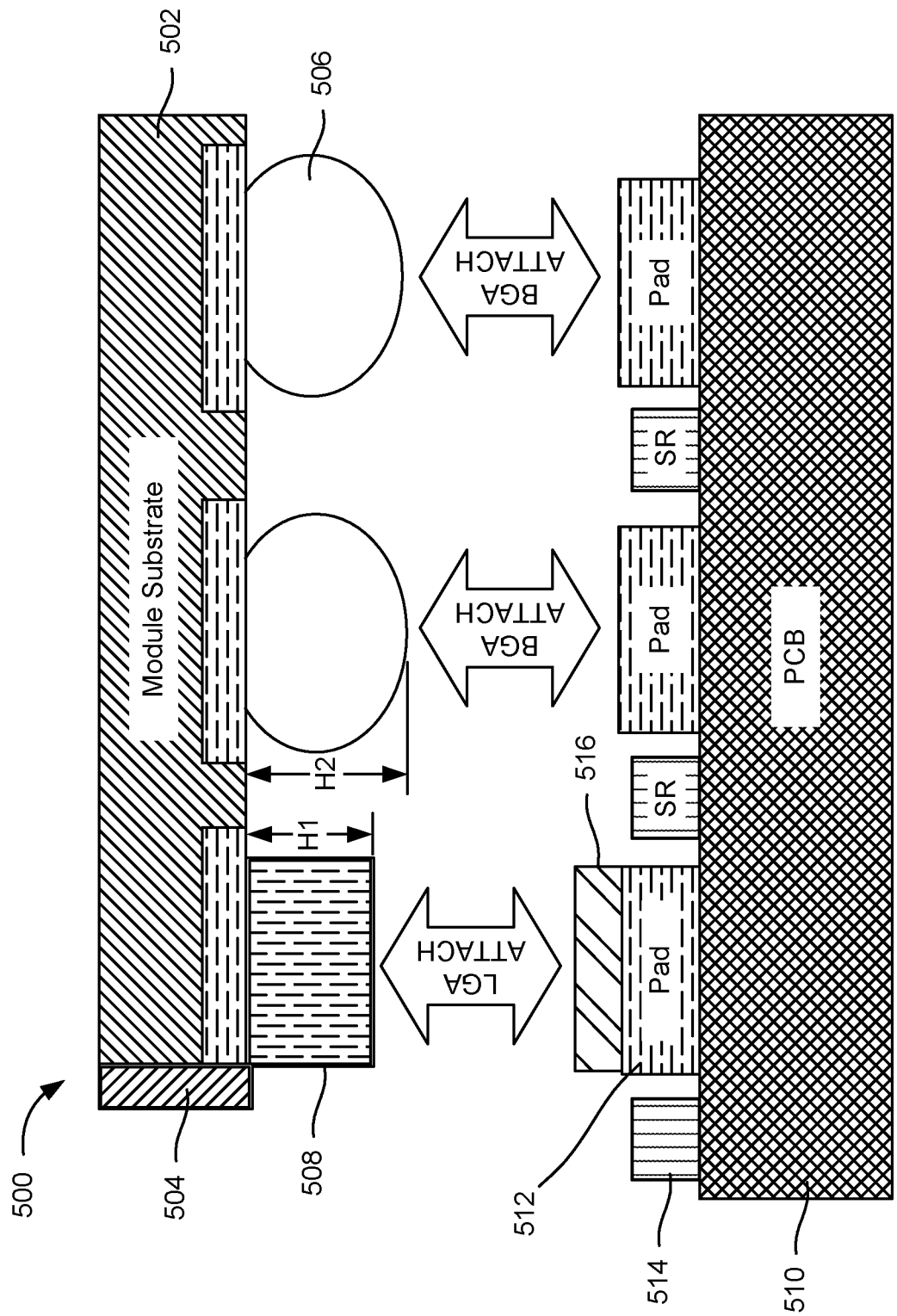
FIG. 5 illustrates the EMI shield pedestal structure in more detail.

FIG. 5 illustrates the EMI shield pedestal structure in more detail. FIG. 5 is a cross sectional view of an apparatus 500, such as apparatus 300 or apparatus 400, having a substrate 502, only a portion of which is shown in FIG. 5. Metal 504 has been sputtered to the bottom of the substrate 502, to which is affixed a number of BGA connectors 506 and an EMI shield pedestal structure 508. In some aspects, the EMI shield pedestal structure 508 is one or more pillar structures, one or more bar structures, some other structure, or some combination of the above. In some aspects, the EMI shield pedestal structure 508 is a conductive paste. In some aspects, the conductive paste may be printed onto the substrate 502 using an inkjet or other printing process. In some aspects, the EMI shield pedestal structure 508 may have a plan view form similar to EMI shield pedestal structure 306 or EMI shield pedestal structure 406.

The apparatus 500 is designed to be joined to a PCB 510, which has metal pads 512 separated by solder resist (SR) 514. The metal pads 512 are electrical connections to which the BGA connectors 506 and the EMI shield pedestal structure 508 will be electrically coupled. The BGA connectors 506 an apparatus 500 will be bonded and electrically coupled to the corresponding metal pad 512 of the PCB 510 by a BGA attach process. The EMI shield pedestal structure 508 of the apparatus 500 will be bonded and electrically coupled to the corresponding metal pad 512 on the PCB 510, which is coated with solder paste 516, via a land grid array (LGA) attach process.

In some aspects, the conductive paste that forms the EMI shield pedestal structure 506 has a height H1 that is less than the height H2 of the BGA connectors 506. This is so because the BGA connectors 506 will compress slightly during the process by which the apparatus 500 is electrically bonded to the PCB 510, ending up with a height that is the same or slightly less than height H1.

FIGS. 6A and 6B illustrate example uses of the apparatus 500. Both Figures show the apparatus 500 mounted to a printed circuit board (PCB) 510 having a set of metal pads on its surface such that the PCB is configured to electrically connect to at least some of the BGA connectors 506 and to at least a portion of the EMI shield pedestal structure 508 that is disposed adjacent to an outer periphery of the ball grid array. In FIG. 6B, the PCB 510 has an open area through which another package or device 206 may be electrically coupled to the apparatus 500. Thus, in FIG. 6B, an additional EMI shield pedestal structure 600 is formed as an inner periphery of the BGA connectors 506, e.g., forming a set of pillars and/or a conductive loop around the other package or device 206. In some aspects, a region within the array of BGA contacts is empty of contacts, and an additional EMI shield pedestal structure is disposed along the periphery of that empty region.

Figures 2A, 2B:
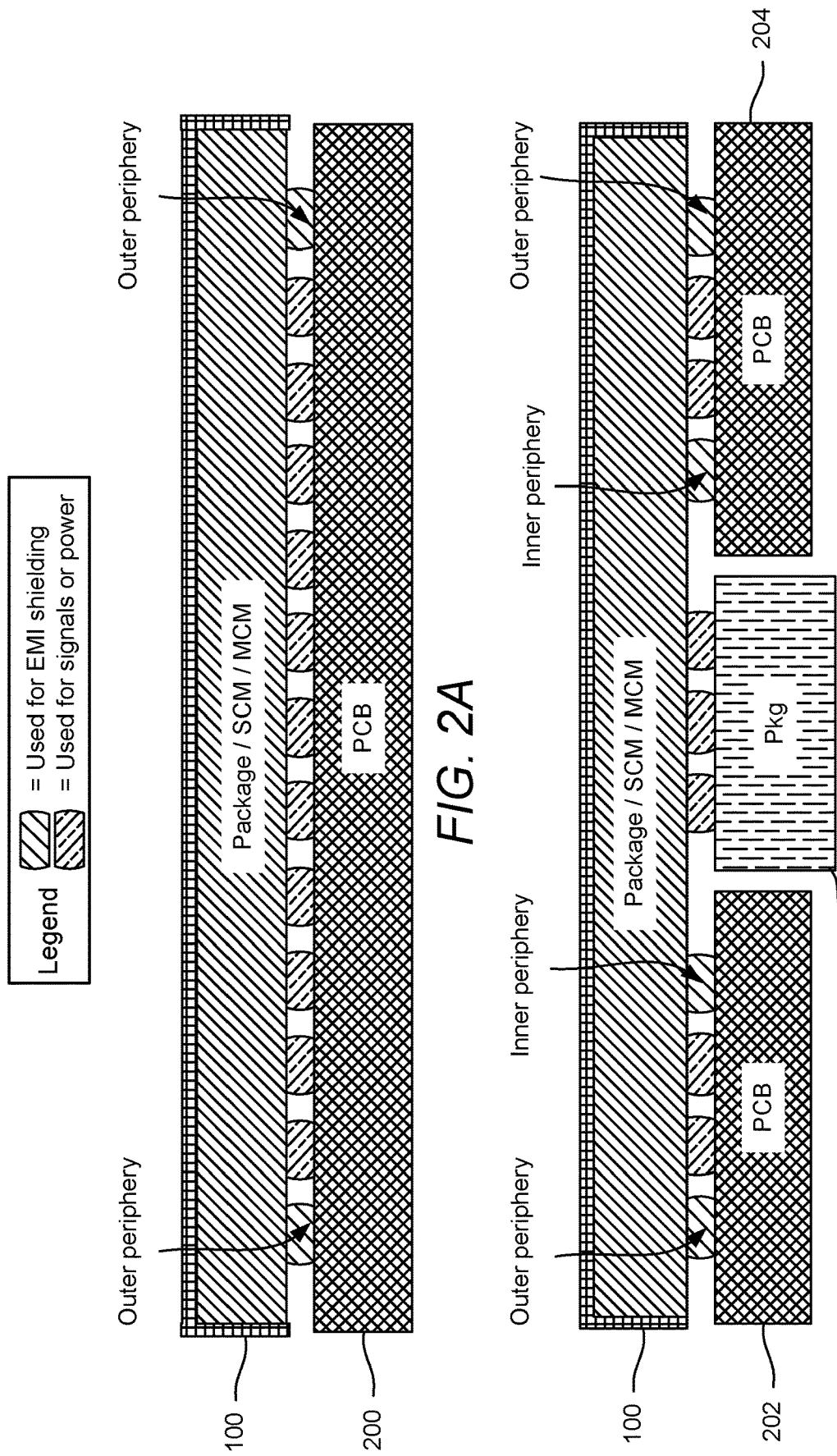
FIGS. 2A and 2B illustrate example uses of the conventional BGA module.

Note that, in contrast to what is shown in FIGS. 2A and 2B, in FIGS. 6A and 6B, all of the BGA connectors 506 may be used for signaling and/or power. None of the BGA connectors 506 are required for EMI shielding, because the EMI shield pedestal structure 508 fulfills that function.

Thus, the apparatus 500 provides several technical advantages over conventional BGA packages and modules. For example, since none of the BGA connectors 506 are needed for EMI shielding, all of the BGA connectors 506 may be used for carrying signals or power. This effectively increases the connector count of the apparatus 500 compared to conventional BGA packages or modules of the same size. Likewise, since it is not necessary to take into account how many BGA connectors 506 have to be used for EMI shielding, it may be possible to use the same circuit in an apparatus 500 having fewer BGA connectors 506, which may be a smaller, less expensive package or module compared to conventional BGA packages or modules. In some aspects, such as shown in FIG. 4, the EMI shield pedestal structure is a continuous structure that can form a closed conductive loop around the outer or inner periphery of the ball grid array. Such a closed loop provides better protection against EMI compared to an EMI shield pedestal structure that is not a closed loop. In some aspects, the EMI shield pedestal structure 508 operates as a conformal structure that protects the BGA connectors 506 and other electrical components from exposure to environmental factors such as moisture, dust, salt, chemicals, mechanical abrasion, corrosion, and so on.

Figure 7:
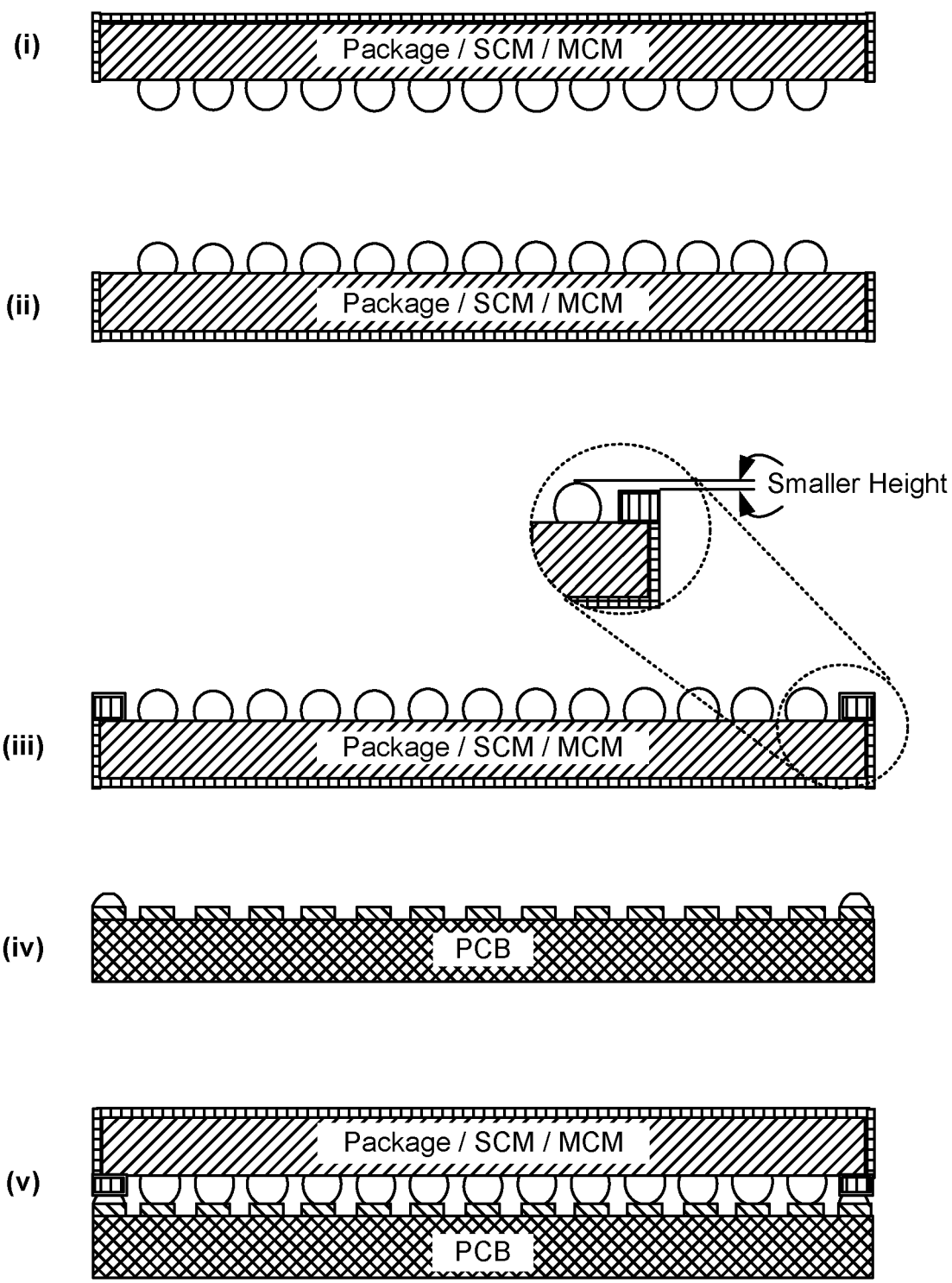
FIG. 7 illustrates fabrication techniques in accordance with one or more aspects of the disclosure.

FIG. 7 illustrates fabrication techniques in accordance with one or more aspects of the disclosure. Referring to FIG. 7, in a partial process 700 portion (i), a BGA package or module is provided after singulation, EMI conformal shielding, and solder ball attach. In partial process 700 portion (ii), the assembly of portion (i) is flipped. In partial process 700 portion (iii), conductive paste is applied, e.g., using an inject process, to produce a structure having a smaller height than the solder balls after collapse. In partial process 700 portion (iv) a PCB is subjected to solder paste printing with conductive paste to create a structure for LGA attach. In partial process 700 portion (v), the assembly of portion (i) is joined to the PCB of portion (iv) and subject to a solder reflow process for the BGA attach and the LGA attach.

It will be appreciated that the foregoing fabrication process was provided merely as general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations.

Figure 8:
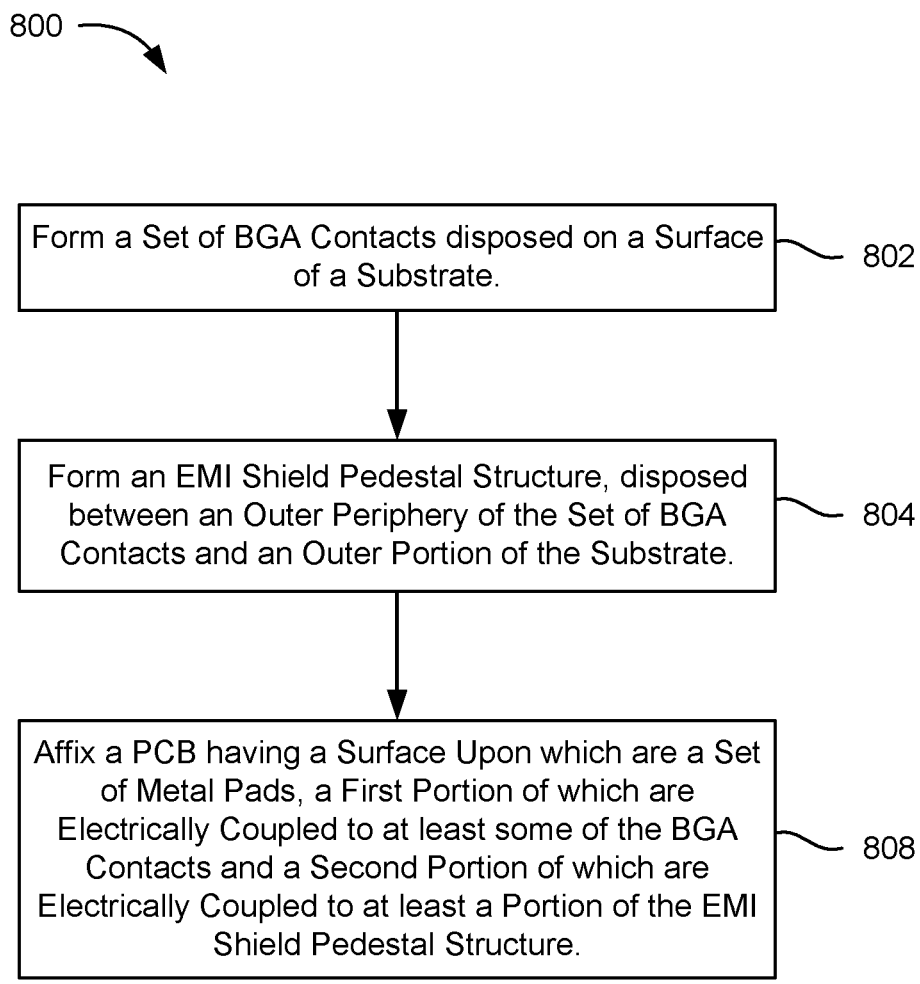
FIG. 8 illustrates a flowchart of an exemplary partial method for manufacturing an apparatus according to one or more aspects of the disclosure.

FIG. 8 illustrates a flowchart of an exemplary partial method 800 for manufacturing an apparatus 500 according to one or more aspects of the disclosure. In FIG. 8, the method includes, at 802, forming a set of BGA contacts disposed on a surface of a substrate. The method includes, at 804, forming an EMI shield pedestal structure, disposed between an outer periphery of the set of BGA contacts and an outer portion of the substrate. The method includes, at 806, affixing a PCB having a surface upon which are a set of metal pads, a first portion of which are electrically coupled to at least some of the BGA contacts, and a second portion of which are electrically coupled to at least a portion of the EMI shield pedestal structure.

Figure 9:
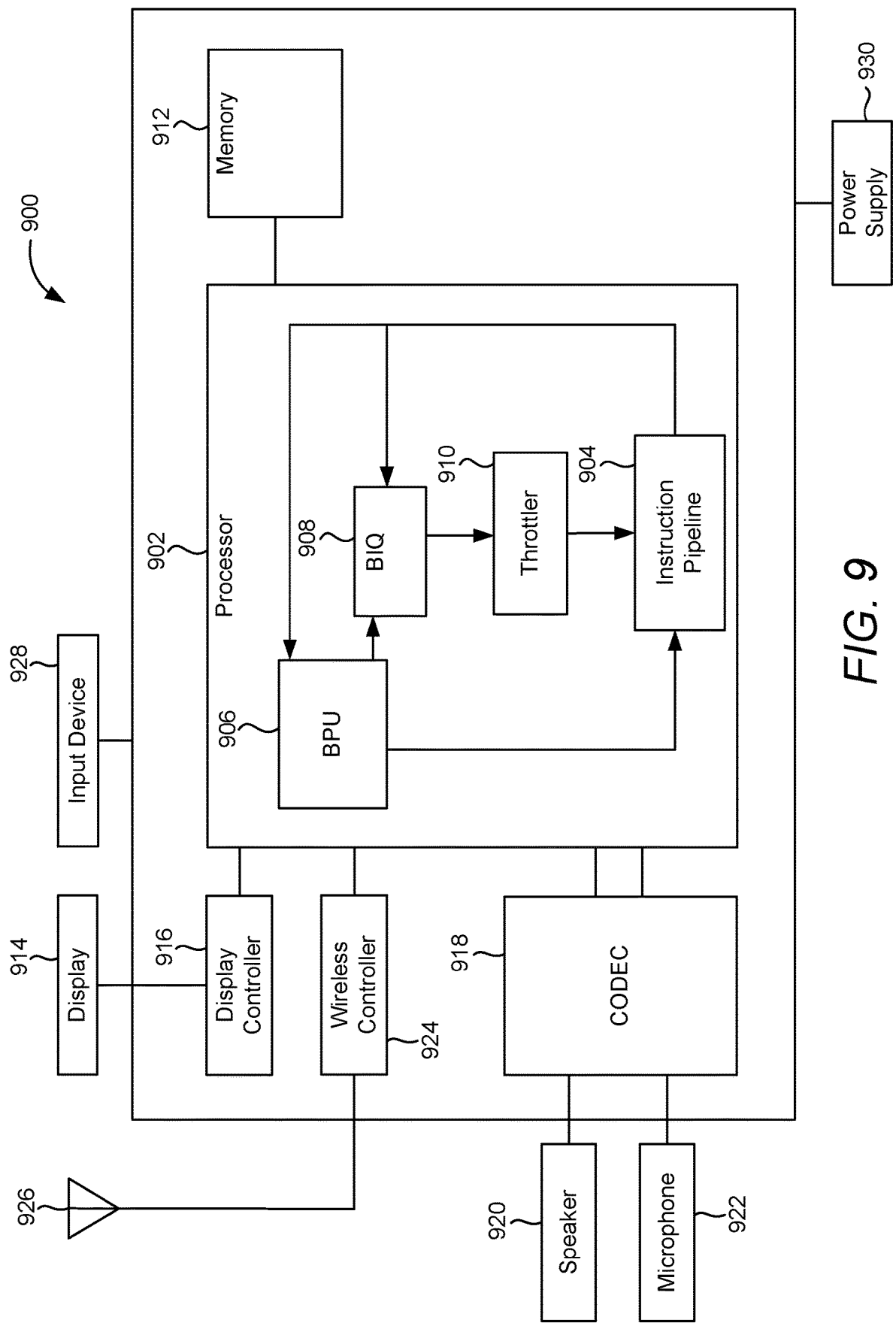
FIG. 9 illustrates an exemplary mobile device in accordance with one or more aspects of the disclosure.

FIG. 9 illustrates an exemplary mobile device in accordance with some examples of the disclosure. Referring now to FIG. 9, a block diagram of a mobile device that is configured according to exemplary aspects is depicted and generally designated mobile device 900. In some aspects, mobile device 900 may be configured as a wireless communication device. As shown, mobile device 900 includes processor 902. Processor 902 is shown to comprise instruction pipeline 904, buffer processing unit (BPU) 906, branch instruction queue (BIQ) 908, and throttler 910 as is well known in the art. Other well-known details (e.g., counters, entries, confidence fields, weighted sum, comparator, etc.) of these blocks have been omitted from this view of processor 902 for the sake of clarity. Processor 902 may be communicatively coupled to memory 912 over a link, which may be a die-to-die or chip-to-chip link. Mobile device 900 also includes display 914 and display controller 916, with display controller 916 coupled to processor 902 and to display 914.

In some aspects, FIG. 9 may include coder/decoder (CODEC) 918 (e.g., an audio and/or voice CODEC) coupled to processor 902; speaker 920 and microphone 922 coupled to CODEC 918; and wireless controller circuits 924 (which may include a modem, radio frequency (RF) circuitry, filters, etc., which may be implemented using one or more flip-chip devices, as disclosed herein) coupled to wireless antenna 926 and to processor 902.

In a particular aspect, where one or more of the above-mentioned blocks are present, processor 902, display controller 916, memory 912, CODEC 918, and wireless controller circuits 924 can be included in a system-in-package or system-on-chip device, including but not limited to apparatuses 300, 400, and 500, which may be implemented in whole or part using the techniques disclosed herein. Input device 928 (e.g., physical or virtual keyboard), power supply 930 (e.g., battery), display 914, input device 928, speaker 920, microphone 922, wireless antenna 926, and power supply 930 may be external to the system-on-chip device and may be coupled to a component of the system-on-chip device, such as an interface or a controller.

It should be noted that although FIG. 9 depicts a mobile device, the processor 902 and memory 912 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 10:
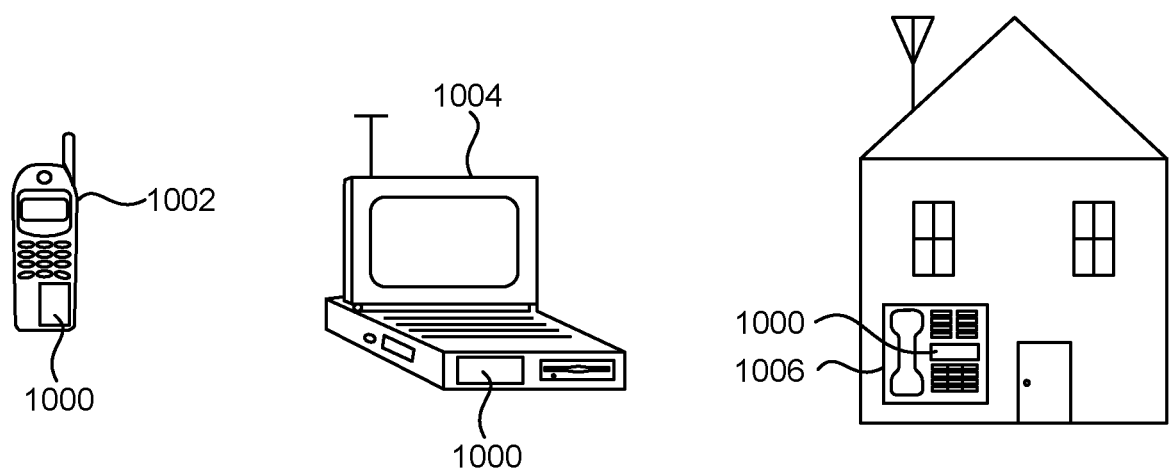
FIG. 10 illustrates various electronic devices that may be integrated with an apparatus in accordance with one or more aspects of the disclosure.

FIG. 10 illustrates various electronic devices that may be integrated with any of the aforementioned integrated device or semiconductor device accordance with various examples of the disclosure. For example, a mobile phone device 1002, a laptop computer device 1004, and a fixed location terminal device 1006 may each be considered generally user equipment (UE) and may include an apparatus 1000, such as apparatuses 300, 400, or 500, as described herein, for example. The device may be, for example, any of the integrated circuits, dies, integrated devices, integrated device packages, integrated circuit devices, device packages, integrated circuit (IC) packages, package-on-package devices described herein. The mobile phone device 1002, laptop computer device 1004, and fixed location terminal device 1006 illustrated in FIG. 10 are merely exemplary. Other electronic devices may also feature device including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed packages, devices, and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into a flip-chip or other package. The packages may then be employed in devices described herein.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 3-10 may be rearranged and/or combined into a single component, process, feature or function or incorporated in several components, processes, or functions. Additional elements, components, processes, and/or functions may also be added without departing from the disclosure. It should also be noted that FIGS. 3-10 and corresponding description in the present disclosure are not limited to dies and/or ICs. In some implementations, FIGS. 3-10 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals.

These terms include, but are not limited to, a music player, a video player, an entertainment unit, a navigation device, a communications device, a smartphone, a personal digital assistant, a fixed location terminal, a tablet computer, a computer, a wearable device, an Internet of thing (IoT) device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), wideband CDMA (W-CDMA), time division multiple access (TDMA), frequency division multiple access (FDMA), Orthogonal Frequency Division Multiplexing (OFDM), Global System for Mobile Communications (GSM), Third Generation Partnership Project (3GPP) Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An apparatus comprising:
   a substrate;
   a plurality of electrical contacts disposed on the surface of the substrate; and an electromagnetic interference (EMI) shield pedestal structure, disposed between an outer periphery of the plurality of electrical contacts and an outer portion of the substrate, wherein a height of the EMI shield pedestal structure is less than a height of the electrical contacts.

2. The apparatus of claim 1, wherein at least one of the plurality of electrical contacts comprises a ball grid array (BGA) contact, a land grid array (LGA) contract, or a copper pillar.

3. The apparatus of claim 1, wherein the EMI shield pedestal structure comprises a conductive paste.

4. The apparatus of claim 1, wherein the EMI shield pedestal structure comprises a plurality of pillar structures.

5. The apparatus of claim 4, wherein the plurality of pillar structures completely enclose the plurality of electrical contacts.

6. The apparatus of claim 1, wherein the EMI shield pedestal structure comprises at least one bar structure.

7. The apparatus of claim 6, wherein the at least one bar structure is formed as continuous bar structure and completely encloses the plurality of electrical contacts.

8. The apparatus of claim 1, further comprising one or more additional EMI shield pedestal structures located within the electrical contacts.

9. The apparatus of claim 1, further comprising one or more additional EMI shield pedestal structures disposed along a periphery of a first region, wherein the first region does not contain any of the plurality of electrical contacts.

10. The apparatus of claim 1, further comprising a printed circuit board (PCB) having disposed on a first surface a plurality of metal pads, a first portion of which are electrically coupled to at least some of the plurality of electrical contacts and a second portion of which are electrically coupled to at least a portion of the EMI shield pedestal structure.

11. The apparatus of claim 10, wherein the first portion of the plurality of metal pads is coupled to the at least some of the plurality of electrical contacts using a ball grid array attach process.

12. The apparatus of claim 10, wherein the second portion of the plurality of metal pads is coupled to the at least a portion of the EMI shield pedestal structure using solder.

13. The apparatus of claim 10, wherein the second portion of the plurality of metal pads is coupled to the at least a portion of the EMI shield pedestal structure using a land grid array attach process.

14. The apparatus of claim 10, wherein the EMI shield pedestal structure comprises a conformal structure.

15. A method for fabricating an apparatus, the method comprising:
   forming a plurality of electrical contacts disposed on a surface of a substrate; and
   forming an electromagnetic interference (EMI) shield pedestal structure, disposed between an outer periphery of the plurality of electrical contacts and an outer portion of the substrate, wherein a height of the EMI shield pedestal structure is less than a height of the electrical contacts.

16. The method of claim 15, wherein at least one of the plurality of electrical contacts comprises a ball grid array (BGA) contact, a land grid array (LGA) contract, or a copper pillar.

17. The method of claim 15, wherein the EMI shield pedestal structure comprises a conductive paste.

18. The method of claim 15, wherein the EMI shield pedestal structure comprises a plurality of pillar structures.

19. The method of claim 18, wherein the plurality of pillar structures completely enclose the plurality of electrical contacts.

20. The method of claim 15, wherein the EMI shield pedestal structure comprises at least one bar structure.

21. The method of claim 20, wherein the at least one bar structure is formed as a continuous bar structure and completely encloses the plurality of electrical contacts.

22. The method of claim 15, further comprising one or more additional EMI shield structures located within the electrical contacts.

* * * * *